(12) United States Patent
Kim et al.

(10) Patent No.: US 9,166,059 B2
(45) Date of Patent: Oct. 20, 2015

(54) THIN FILM TRANSISTOR, ARRAY SUBSTRATE AND MANUFACTURING METHOD THEREOF, AND DISPLAY PANEL

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Won Seok Kim, Beijing (CN); Pil Seok Kim, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

(*) Notice: Subject to any disclaimer, the term of this patent is extended or adjusted under 35 U.S.C. 154(b) by 212 days.

(21) Appl. No.: 13/876,673

(22) PCT Filed: Nov. 8, 2012

(86) PCT No.: PCT/CN2012/084323
§ 371 (c)(1),
(2) Date: Mar. 28, 2013

(87) PCT Pub. No.: WO2013/155835
PCT Pub. Date: Oct. 24, 2013

(65) Prior Publication Data
US 2015/0028418 A1    Jan. 29, 2015

(30) Foreign Application Priority Data

Apr. 16, 2012  (CN) .......................... 2012 1 0112450

(51) Int. Cl.
*H01L 29/66*  (2006.01)
*H01L 21/84*  (2006.01)
(Continued)

(52) U.S. Cl.
CPC ........ *H01L 29/78696* (2013.01); *H01L 27/124* (2013.01); *H01L 27/1288* (2013.01);
(Continued)

(58) Field of Classification Search
CPC ........................ H01L 27/124; H01L 29/78621
USPC ................................... 257/335–337; 438/163
See application file for complete search history.

(56) References Cited

U.S. PATENT DOCUMENTS

| | | | |
|---|---|---|---|
| 6,950,168 B2 * | 9/2005 | Yamazaki et al. | 349/141 |
| 8,253,873 B2 * | 8/2012 | Sasaki et al. | 349/38 |
| 2009/0059110 A1 | 3/2009 | Sasaki et al. | |

FOREIGN PATENT DOCUMENTS

| | | |
|---|---|---|
| CN | 101894807 A | 11/2010 |
| CN | 202093289 U | 12/2011 |
| CN | 102651403 A | 8/2012 |
| CN | 202512328 A | 10/2012 |

OTHER PUBLICATIONS

Chinese Rejection Decision dated Sep. 18, 2014; Appln. No. 201210112450.0.

(Continued)

*Primary Examiner* — Calvin Lee
(74) *Attorney, Agent, or Firm* — Ladas & Parry LLP

(57) ABSTRACT

Embodiments of the invention provide a thin film transistor, an array substrate and a manufacturing method thereof, and a display panel. The thin film transistor comprises: an active layer pattern, a source electrode, a drain electrode and a gate electrode. The gate electrode is positioned above the active layer pattern, the source electrode is connected with the active layer pattern, the drain electrode is connected with the active layer pattern, and the source electrode and the drain electrode are disposed in an adjacent layer of the active layer pattern.

8 Claims, 5 Drawing Sheets

(51) Int. Cl.
  *H01L 29/786*  (2006.01)
  *H01L 27/12*  (2006.01)
  *H01L 29/417*  (2006.01)

(52) U.S. Cl.
  CPC ...... *H01L27/1296* (2013.01); *H01L 29/41733* (2013.01); *H01L 29/66742* (2013.01); *H01L 29/78621* (2013.01)

(56) References Cited

OTHER PUBLICATIONS

International Preliminary Report on Patentability dated Oct. 21, 2014; PCT/CN2012/084323.
International Search Report dated Feb. 14, 2013; PCT/CN2012/084323.

\* cited by examiner

THIN FILM TRANSISTOR, ARRAY SUBSTRATE AND MANUFACTURING METHOD THEREOF, AND DISPLAY PANEL

BACKGROUND

Embodiments of the invention relate to a thin film transistor, an array substrate, a manufacturing method of the array substrate, and a display panel.

Array substrate is an important component of a display panel. At present, low temperature poly-silicon (LTPS) material may be used to manufacture the array substrate. Due to problems in thermal process of LTPS, the array substrate generally adopts a top gate structure. FIG. 6 is a structural schematic view of a conventional array substrate. As shown in FIG. 6, the conventional array substrate comprises a substrate 17, and gate lines (not shown) and data lines 14 located on the array substrate. The gate lines and the data lines 14 cross with each other to define pixel regions. In each pixel region, there are formed a pixel electrode 18, a thin film transistor and a common electrode 19. The common electrode 19 forms a fringe electric field with the pixel electrode 18. The thin film transistor comprises an active layer pattern 10, a source electrode 11, a drain electrode 12 and a gate electrode 13. A buffer layer 21 is formed on the substrate 17. The active layer pattern 10 is formed on the buffer layer 21. The active layer pattern 10 comprises a channel region 10a, a lightly doped drain (LDD) region 10b, a source region 10c and a drain region 10d. The source region 10c and the drain region 10d are regions doped with impurity at a high concentration. The LDD region 10b is a region doped with impurity at a low concentration. A third insulation layer 22 is formed on the active layer pattern 10. The gate line and the gate electrode 13 are formed on the third insulation layer 22 at the same time, the gate line and the gate electrode 13 are connected with each other, and the gate electrode 13 is provided above the active layer pattern 10. A fourth insulation layer 23 is formed on the gate electrode 13. The pixel electrode 18 is formed on the fourth insulation layer 23. A first via hole 24 is formed in the third insulation layer 22 and the fourth insulation layer 23 above the active layer pattern 10, and the source electrode 11 is filled in the first via hole 24 to be connected with the active layer pattern 10. The source electrode 11 is also connected with the data line 14. A second via hole 25 is further formed in the third insulation layer 22 and the fourth insulation layer 23 above the active layer pattern 10, and the drain electrode 12 is filled in the second via hole 25 to be connected with the active layer pattern 10. The drain electrode 12 is partially provided on the pixel electrode 18 to be connected with the pixel electrode 18. A protection layer 26 is formed on the source electrode 11 and the drain electrode 12, and the common electrode 19 is formed on the protection layer 26.

As described above, in the conventional array substrate, the source electrode and the active layer pattern of the thin film transistor are connected with each other by via hole, and the drain electrode and the active layer pattern are also connected with each other by via hole. However, when via holes are formed in the pixel region, the aperture ratio of the pixel region is reduced.

SUMMARY

According to an embodiment of the invention, there is provided a thin film transistor. The thin film transistor comprises: an active layer pattern, a source electrode, a drain electrode and a gate electrode. The gate electrode is positioned above the active layer pattern, the source electrode is connected with the active layer pattern, the drain electrode is connected with the active layer pattern, and the source electrode and the drain electrode are disposed in an adjacent layer of the active layer pattern.

According to another embodiment of the invention, there is provided an array substrate. The array substrate comprises a base substrate, and gate lines and data lines located above the base substrate. The gate lines and the data lines cross with each other to define a plurality of pixel regions, and a pixel electrode and a thin film transistor is formed in each of the pixel regions. The thin film transistor comprises an active layer pattern, a source electrode, a drain electrode and a gate electrode, the gate electrode is positioned above the active layer pattern, the source electrode is respectively connected with the active layer pattern and one of the data lines, the drain electrode is respectively connected with the active layer pattern and the pixel electrode, and the source electrode and the drain electrode are disposed in an adjacent layer of the active layer pattern.

According to another embodiment of the invention, there is provided a display panel. The display panel comprises the above thin film transistor.

According to another embodiment of the invention, there is provided a method of manufacturing an array substrate. The method comprises: Step 100, forming an active layer pattern and a pixel electrode on a base substrate; Step 102, forming data lines, a source electrode and a drain electrode on the base substrate after the step 100, on end of the source electrode is connected with one of the data lines, the other end of the source electrode is formed on the active layer pattern, one end of the drain electrode is formed on the active layer pattern, and the other end of the drain electrode is formed on the pixel electrode; Step 104, forming a first insulation layer on the base substrate after the step 102, wherein the first insulation layer covers the base substrate; and Step 106, forming gate lines and a gate electrode on the first insulation layer, wherein the gate electrode is connected with one of the gate lines and is located above the active layer pattern.

According to the embodiments of the invention, the source electrode and the drain electrode are disposed in the adjacent layer of the active layer pattern, thus the source electrode and the drain electrode are directly connected with the active layer pattern without the necessity of forming via holes. Accordingly, the via holes in the pixel regions can be avoided, and the aperture ratio of the pixel region can be improved.

BRIEF DESCRIPTION OF THE DRAWINGS

In order to describe the technical solutions in the embodiments of the invention more clearly, a brief description will be given below to the figures. Obviously, the figures in the following description are only some embodiments of the invention, not intended to limit the invention.

DETAILED DESCRIPTION

The technical solution in the embodiments of the invention will be clearly and fully described below in connection with figures in the embodiments of the invention. Obviously, the described embodiments are only a portion of the embodiments of the invention, not all embodiments. Based on the embodiments in the invention, all other embodiments, which may be obtained by those skilled in the art without paying creative labor, belong to the protection scope of the invention.

First Embodiment

Figure 1:
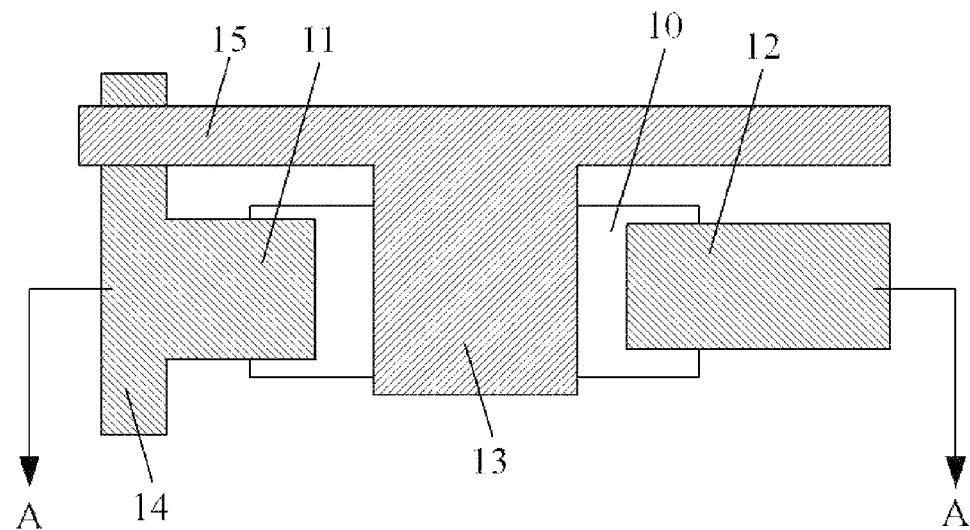
FIG. 1 is a plan schematic view of a thin film transistor according to a first embodiment of the invention.
Figure 2:
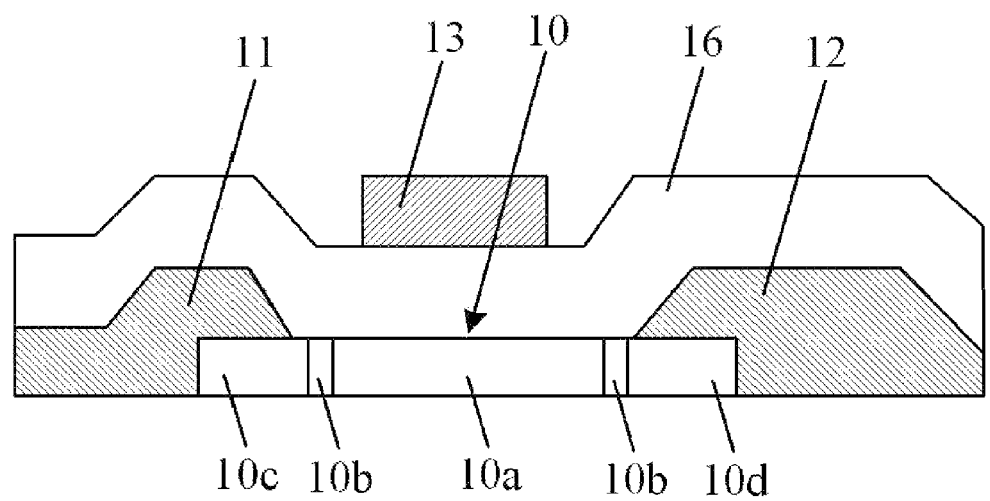
FIG. 2 is a cross sectional view taken along a line A-A in FIG. 1.

FIG. 1 is a plan schematic view of a thin film transistor according to the first embodiment of the invention. FIG. 2 is a cross-section view taken along a line A-A in FIG. 1. As shown in FIGS. 1 and 2, the thin film transistor (TFT) comprises: an active layer pattern 10, a source electrode 11, a drain electrode 12 and a gate electrode 13. The gate electrode 13 is located above the active layer pattern 10. The source electrode 11 is connected with the active layer pattern 10, the drain electrode 12 is connected with the active layer pattern 10, and the source electrode 11 and the drain electrode 12 are disposed in an adjacent layer of the active layer pattern 10.

The source electrode 11 and the drain electrode 12 are disposed in a same layer as data lines 14, and the source electrode 11 is connected with one of the data line 14. The gate electrode 13 is disposed in a same layer as the gate line 15, and the gate electrode 13 is connected with one of the gate line 15. The gate lines 15 are located above the data lines 14, and a first insulation layer 16 is formed between the data lines 14 and the gate lines 15. The gate electrode 13 is located on the first insulation layer 16 above the active layer pattern 10.

The source electrode 11 is formed on the active layer pattern 10 and the drain electrode 12 is formed on the active layer pattern 10, so that the source electrode 11 and the drain electrode 12 are disposed in the adjacent layers of active layer pattern 10.

As shown in FIG. 2, the active layer pattern 10 comprises: a channel region 10a, a lightly doped drain (LDD) region 10b, a source region 10c and a drain region 10d. The source region 10c and the drain region 10d are regions doped with impurity at a high concentration, and the LDD region 10b is a region doped with impurity at a low concentration. The LDD region 10b is formed between the source region 10c and the channel region 10a, and between the drain region 10d and the channel region 10a. The source electrode 11 is formed on the source region 10c, the drain electrode 12 is formed on the drain region 10d, and the gate electrode 13 is formed on the first insulation layer 16 above the channel region 10a.

In the present embodiment, alternatively, the active layer pattern may be formed on the source electrode and the drain electrode so that the source electrode and the drain electrode are also disposed in the adjacent layers of active layer pattern, and the details of this structure are omitted here.

The thin film transistor according to the present embodiment may be applied to a display panel. For example, the display panel may be a liquid crystal display panel or an active matrix organic light emitting diode (AMOLED) panel. When the thin film transistor is applied to the liquid crystal display, the thin film transistor is provided on an array substrate, and one thin film transistor is generally needed to drive each pixel on the array substrate. When the thin film transistor is applied to the AMOLED panel, the thin film transistor is provided in a driving circuit, and more than two thin film transistors are generally needed to drive the organic light emitting diode (OLED) in each pixel.

In the thin film transistor according to the present embodiment, the source electrode and the drain electrode are disposed in the adjacent layer of the active layer pattern, thus the source electrode and the drain electrode are directly connected with the active layer pattern without the necessity of forming via holes. Accordingly, the via holes in the pixel regions can be avoided, and the aperture ratio of the pixel region can be improved.

Second Embodiment

Figure 3:
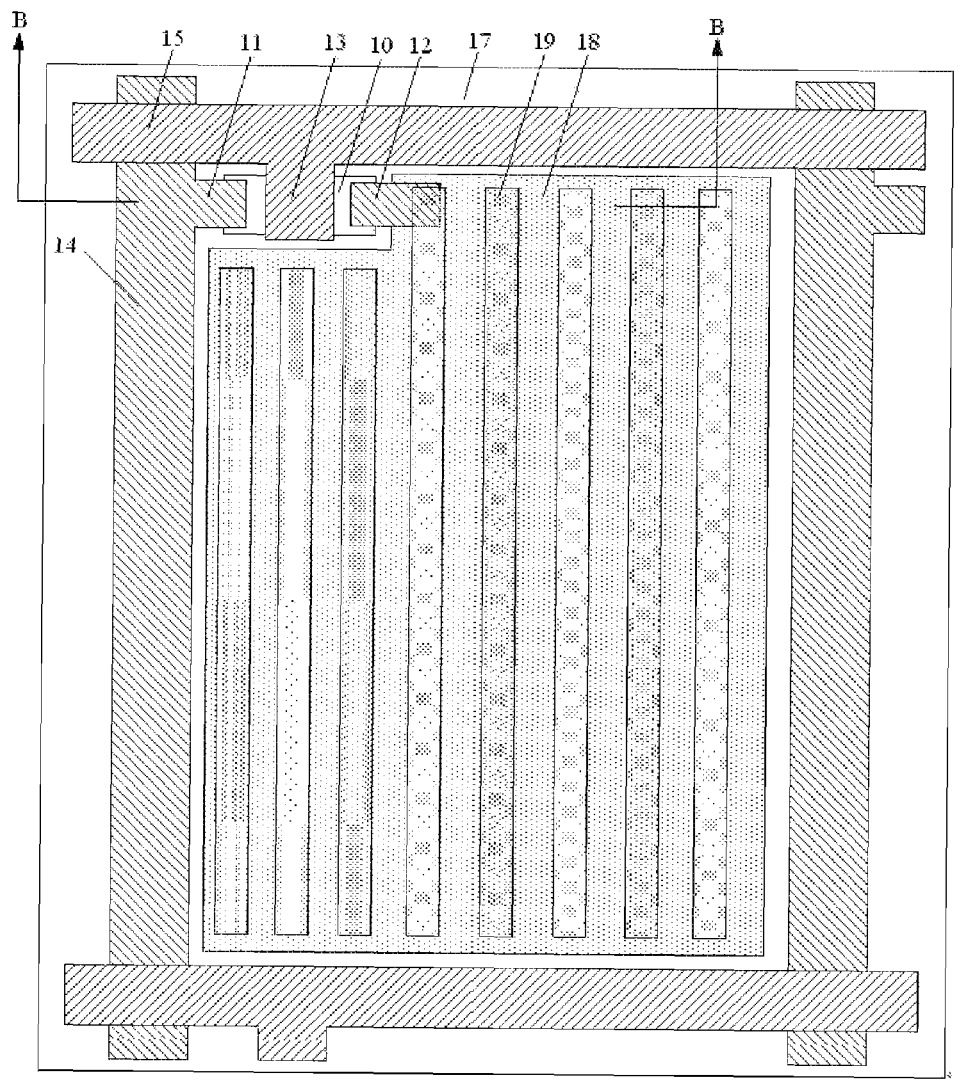
FIG. 3 is a structural schematic view of an array substrate according to a second embodiment of the invention.
Figure 4:
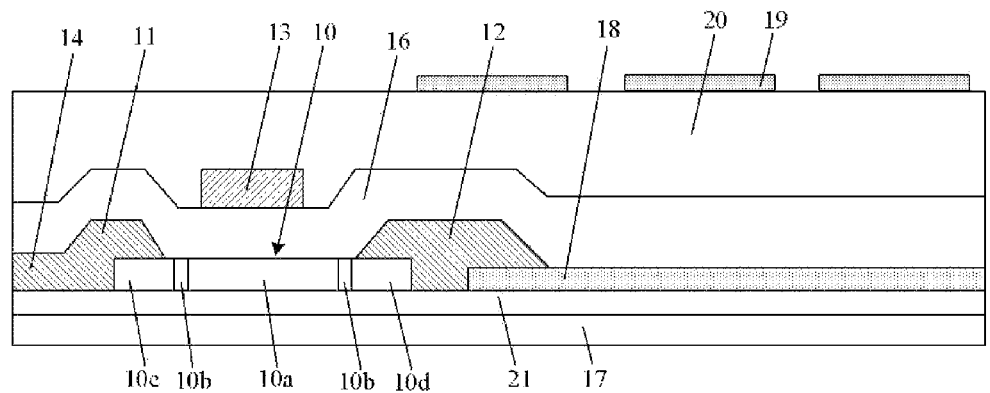
FIG. 4 is a cross sectional view taken along a line B-B in FIG. 3.

FIG. 3 is a structural schematic view of an array substrate according to the second embodiment of the invention, and FIG. 4 is a cross sectional view taken along a line B-B in FIG. 3. As shown in FIGS. 3 and 4, the array substrate comprises a base substrate 17, and gate lines 15 and data lines 14 provided above the base substrate 17. The gate lines 15 and the data lines 14 crosses with each other to define pixel regions. In each of the pixel region, there are formed a pixel electrode 18, a thin film transistor and a common electrode 19. The common electrode 19 forms an electric field with the pixel electrode 18. The thin film transistor comprises an active layer pattern 10, a source electrode 11, a drain electrode 12 and a gate electrode 13. The gate electrode 13 is formed above the active layer pattern 10. The source electrode 11 is respectively connected with the active layer pattern 10 and the data line 14, and the drain electrode 12 is respectively connected with the active layer pattern 10 and the pixel electrode 18. The source electrode 11 and the drain electrode 12 are disposed in an adjacent layer of the active layer pattern 10. The drain electrode 12 and the pixel electrode 18 are disposed in adjacent layers.

The active layer pattern 10 is formed on the base substrate 17, and the pixel electrode 18 is also formed on the base substrate 17. The source electrode 11 is disposed in a same layer as the data lines 14, one end of the source electrode 11 is connected with one of the data lines 14, and the other end of the source electrode is formed on the active layer pattern 10 so that the source electrode 11 is disposed in the adjacent layer of the active layer pattern 10. The drain electrode 12 is disposed in a same layer as the data lines 14, one end of the drain electrode 12 is formed on the pixel electrode 18, and the other end of the drain electrode is formed on the active layer pattern 10 so that the drain electrode 12 is disposed in the adjacent layer of the active layer pattern 10.

The gate lines 15 are aimed above the data lines 14, and a first insulation layer 16 is formed between the gate lines 15 and the data lines 14. The first insulation layer 16 covers the entire base substrate 17. The gate electrode 13 and the gate lines 15 are disposed in a same layer, and the gate electrode 13 is connected with one of the gate lines 15. The gate electrode 13 is formed on the first insulation layer 16 above the active layer pattern 10. A second insulation layer 20 is formed on the gate lines 15, and the second insulation layer 20 covers the entire base substrate 17. The common electrode 19 is formed on the second insulation layer 20.

In the present embodiment, preferably, the pixel electrode 18 is a flat plate electrode, and the common electrode 19 is a slit electrode having slits.

As shown in FIG. 4, the active layer pattern 10 comprises: a channel region 10a, a lightly doped drain (LDD) region 10b, a source region 10c and a drain region 10d. The source region 10c and the drain region 10d are regions doped with impurity at a high concentration, and the LDD region 10b is a region doped with impurity at a low concentration. The LDD region 10b is formed between the source region 10c and the channel region 10a, and between the drain region 10d and the channel region 10a. The source electrode 11 is formed on the source region 10c, the drain electrode 12 is formed on the drain region 10d, and the gate electrode 13 is formed on the insulation layer 16 above the channel region 10a.

Alternatively, a buffer layer 21 may be formed on the base substrate 17, and the buffer layer 21 covers the entire base substrate 17. At this time, the active layer pattern 10 and the pixel electrode 18 are formed on the buffer layer 21.

In the present embodiment, alternatively, the active layer pattern may be formed on the source electrode and the drain electrode so that the source electrode and the drain electrode are also disposed in the adjacent layers of active layer pattern, and the details of this structure are omitted here.

In the present embodiment, alternatively, the common electrode may be formed under the pixel electrode. At this time, an insulation layer needs to be formed between the common electrode and the pixel electrode. The details of this structure are omitted here In the present embodiment, alternatively, the common electrode may be not disposed on the array substrate.

The structure of the array substrate shown in FIG. 3 is only one embodiment of the invention. In practical applications, the position and layer of various components may be changed according to demands, and the details thereof are not described one by one here.

In the array substrate according to the present embodiment, the source electrode and the drain electrode are disposed in the adjacent layer of the active layer pattern, thus the source electrode and the drain electrode are directly connected with the active layer pattern without the necessity of forming via holes. In addition, the drain electrode is disposed in the adjacent layer of the pixel electrode, thus the drain electrode and the pixel electrode are directly connected with each other without the necessity of forming via holes. Thereby, the via holes in the pixel regions can be avoided, and the aperture ratio of the pixel region can be improved.

Third Embodiment

The third embodiment of the invention provides a display panel, and the display panel comprises a thin film transistor. The thin film transistor may adopt the thin film transistor according to the above first embodiment. For example, the display panel may be a liquid crystal display panel or AMOLED panel. When the display panel is the liquid crystal display panel, the liquid crystal display panel comprises a color filter substrate and an array substrate facing each other, and a liquid crystal layer interposed between the color filter substrate and the array substrate, the thin film transistor is provided on the array substrate, and one thin film transistor is generally needed to drive each pixel on the array substrate. When the display panel is the AMOLED panel, the thin film transistor is provided in a driving circuit, and more than two thin film transistors are generally needed to drive the organic light emitting diode (OLED) in each pixel.

Fourth Embodiment

The fourth embodiment of the invention provides a method of manufacturing an array substrate. The method comprises the following steps.

Step 100, forming an active layer pattern and a pixel electrode on a base substrate.

For example, the step 100 may comprise the following steps.

Step 1001, forming the active layer pattern on the base substrate.

Figure 5A:
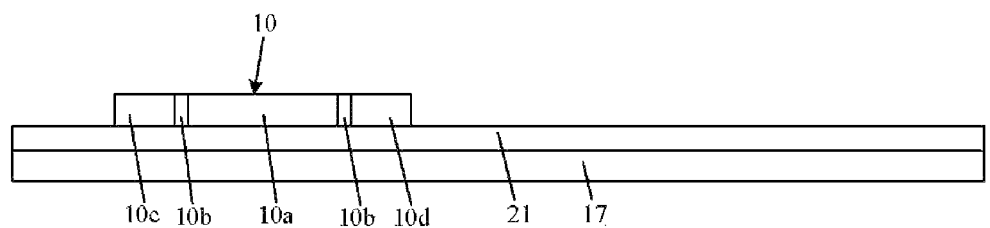
FIG. 5a is a schematic view of forming an active layer pattern in a fourth embodiment of the invention.

FIG. 5a is a schematic view of forming the active layer pattern in the fourth embodiment. As shown in FIG. 5a, the active layer pattern 10 is formed on the base substrate 17 by a patterning process. The active layer pattern 10 comprises a channel region 10a, a lightly doped drain region 10b, a source region 10c and a drain region 10d. Further, the step 1001 may comprise: forming a main body of the active layer pattern on the base substrate 17 and forming the channel region 10a, the lightly doped drain region 10b and the source region 10c and the drain region 10d by doping the main body of the active layer pattern. Specifically, forming the main body of the active layer pattern on the base substrate 17 by a patterning process; forming the lightly doped drain region 10b by doping the main body of the active layer pattern through a mask, wherein a region between the lightly doped drain regions 10b is the channel region 10a; forming the source region 10c and the drain region 10d by doping the main body of the active layer pattern through a mask. The order of forming the light doped drain region 10b and forming the source region 10c and the drain region 10d may be changed according to demands.

Step 1002, forming the pixel electrode on the base substrate.

The order of the step 1001 and the step 1002 may be exchanged.

Figure 5B:
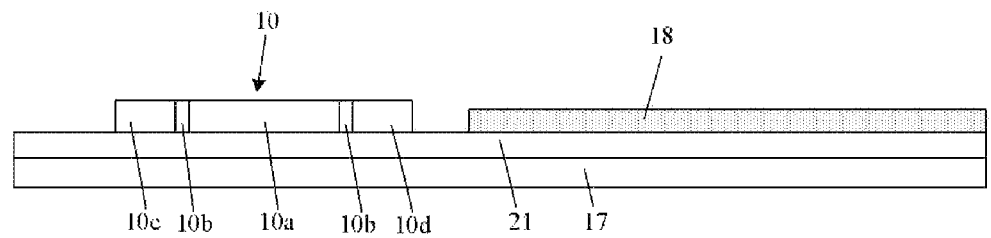
FIG. 5b is a schematic view of forming a pixel electrode in the fourth embodiment of the invention.

FIG. 5b is a schematic view of forming the pixel electrode in the fourth embodiment. As shown in FIG. 5b, the pixel electrode 18 is formed on the base substrate 17 by a patterning process.

Alternatively, before the step 100, the method may comprise forming a buffer layer 21 on the base substrate 17. The buffer layer 21 covers the entire base substrate 17. In such case, the active layer pattern 10 and the pixel electrode 18 are formed on the buffer layer 21.

Step 102, forming data lines, a source electrode and a drain electrode on the base substrate after the step 100, wherein one end of the source electrode is connected with one of the data lines, the other end of the source electrode is formed on the active layer pattern, one end of the drain electrode is formed on the active layer pattern, and the other end of the drain electrode is formed on the pixel electrode.

Figure 5C:
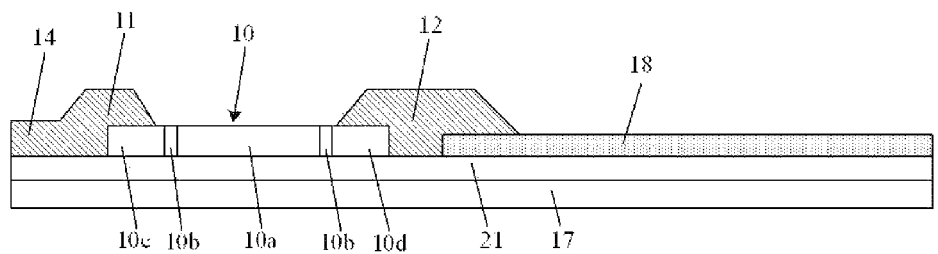
FIG. 5c is a schematic view of forming a source electrode and a drain electrode in the fourth embodiment of the invention.

FIG. 5c is a schematic view of forming the source and drain electrodes in the fourth embodiment. As shown in FIG. 5c, the data line 14, the source electrode 11 and the drain electrode 12 are formed on the base substrate 17 after the step 100 at the same time by a patterning process. One end of the source electrode 11 is connected with the data line 14, and the other end of the source electrode 11 is formed on the active layer pattern 10. One end of the drain electrode 12 is formed on the active layer pattern 10, and the other end of the drain electrode 12 is formed on the pixel electrode 18.

Step 104, forming a first insulation layer on the base substrate after the step 102. The first insulation layer covers the base substrate.

Figure 5D:
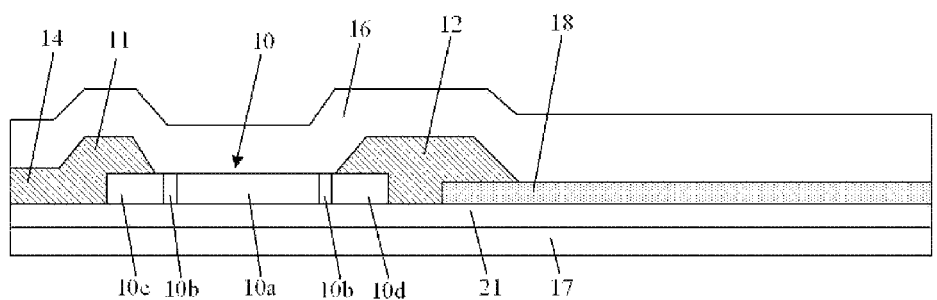
FIG. 5d is a schematic view of forming a first insulation layer in the fourth embodiment of the invention.

FIG. 5d is a schematic view of forming the first insulation layer in the fourth embodiment. As shown in FIG. 5d, the first insulation layer 16 is coated on the base substrate 17 after the step 102, and the first insulation layer covers the entire base substrate 17.

Step 106, forming gate lines and a gate electrode on the first insulation layer. The gate electrode is connected with one of the gate lines and is located above the active layer pattern.

Figure 5E:
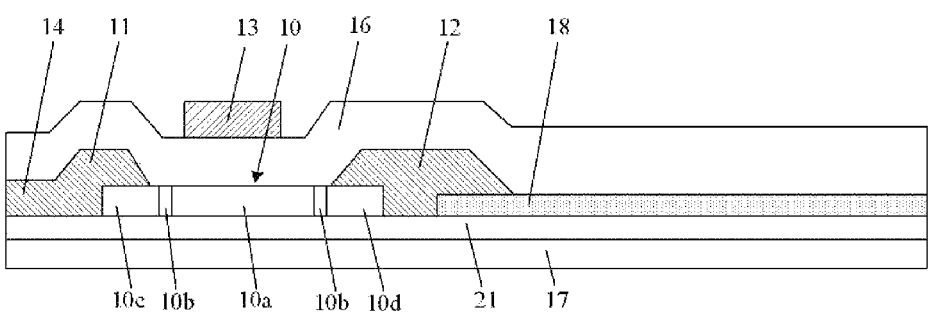
FIG. 5e is a schematic view of forming a gate electrode in the fourth embodiment of the invention.

FIG. 5e is a schematic view of forming the gate electrode in the fourth embodiment. As shown in FIG. 5e, the gate line 15 and the gate electrode 13 are formed on the first insulation layer 16 at the same time by a pattern process. The gate electrode 13 is connected with the gate line 15 and is located above the active layer pattern 10. The gate line 15 is shown in FIG. 3.

Step 108, forming a second insulation layer on the base substrate after the step 106. The second insulation layer covers the base substrate.

Figure 5F:
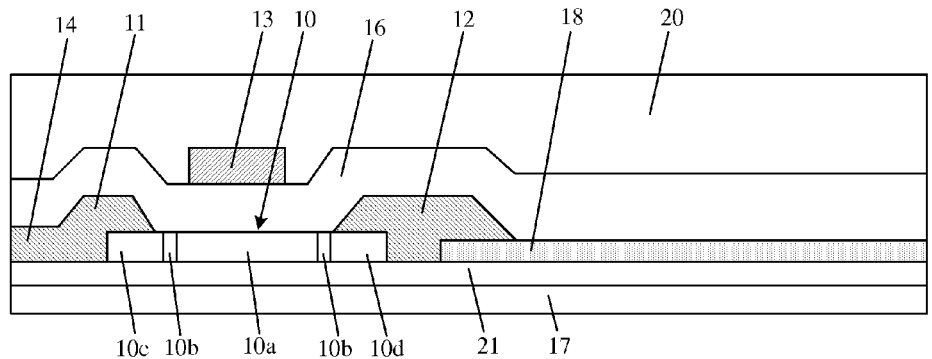
FIG. 5f is a schematic view of forming a second insulation layer in the fourth embodiment of the invention.
Figure 6:
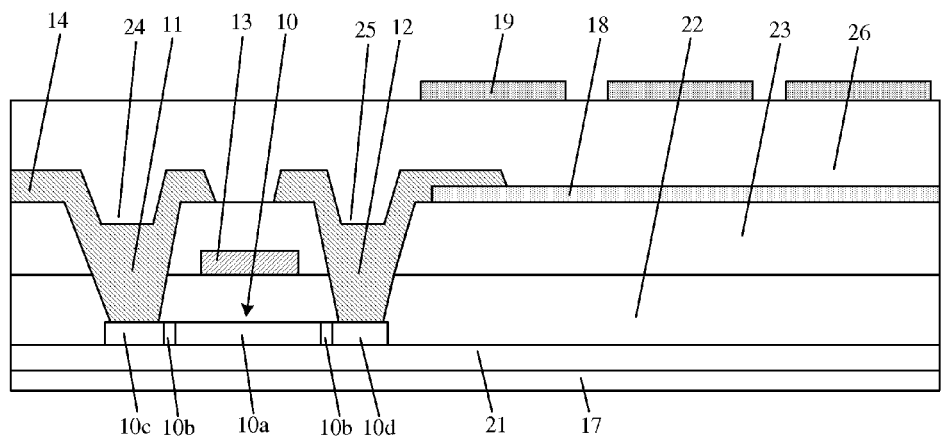
FIG. 6 is a structural schematic view of a conventional array substrate.

FIG. 5f is a schematic view of forming the second insulation layer in the fourth embodiment. As shown in FIG. 5f, the second insulation layer 20 is coated on the base substrate 17 after the step 106, and the second insulation layer 20 covers the entire base substrate 17. Further, a planarization treatment may be performed on the second insulation layer 20.

Step 110, forming a common electrode on the second insulation layer.

As shown in FIG. 3, the common electrode 19 is formed on the second insulation layer 20 by a patterning process.

In the present embodiment, the gate lines and the data lines define a plurality of pixel regions, and the plurality of pixel regions form a display region.

In the present embodiment, after the step 108 and before the step 110, the method may further comprise: forming via holes in a peripheral region outside of the display region. For example, the via holes may be formed in the peripheral region by a patterning process.

In the present embodiment, alternatively, the step of forming the common electrode may not be included.

In the present embodiment, at most 8 patterning processes are needed to complete the step 100 to the step 110, that is, the method of manufacturing the array substrate is completed by using eight masks.

The manufacturing method according to the present embodiment may be applied to manufacture the array substrate described in the above second embodiment.

In the present embodiment, the source electrode and the drain electrode are respectively disposed in the adjacent layer of the active layer pattern, thus the source electrode and the drain electrode are directly connected with the active layer pattern without the necessity of forming via holes. In addition, the drain electrode is disposed in the adjacent layer of the pixel electrode, thus the drain electrode and the pixel electrode are directly connected with each other without the necessity of forming via holes. Thereby, the via holes in the pixel regions can be avoided, and the aperture ratio of the pixel region can be improved. In addition, since the step of forming via holes in the pixel regions is not needed, one patterning process is removed compared with the conventional technology, and thus the production cost can be reduced.

It should be understood that, the above embodiments are only exemplary embodiments used to illustrate the principles of the invention, and the invention is not limited thereto. The structure of the thin film transistor in the embodiments of the invention may be PMOS or NMOS.

The foregoing descriptions are only exemplary embodiments of the invention, and are not used to define the protection scope of the invention. The protection scope of the invention is defined by the appended claims.

What is claimed is:

1. A thin film transistor, comprising an active layer pattern, a source electrode, a drain electrode and a gate electrode,
   wherein the gate electrode is positioned above the active layer pattern, the source electrode and the drain electrode, the source electrode is connected with the active layer pattern, the drain electrode is connected with the active layer pattern, and the source electrode and the drain electrode are disposed in an adjacent layer of the active layer pattern without any layer formed between the active layer pattern and the source electrode, or between the active layer pattern and the drain electrode.

2. The thin film transistor according to claim 1, wherein the active layer pattern comprises a channel region, a lightly doped drain region, a source region and a drain region, and the lightly doped drain region is formed between the source region and the channel region and between the drain region and the channel region.

3. An array substrate, wherein the array substrate comprises a base substrate, and gate lines and data lines located above the base substrate, wherein the gate lines and the data lines cross with each other to define a plurality of pixel regions, and a pixel electrode and a thin film transistor is formed in each of the pixel regions,
   the thin film transistor comprises an active layer pattern, a source electrode, a drain electrode and a gate electrode, the gate electrode is positioned above the active layer pattern, the source electrode and the drain electrode, the source electrode is respectively connected with the active layer pattern and one of the data lines, the drain electrode is respectively connected with the active layer pattern and the pixel electrode, and the source electrode and the drain electrode are disposed in an adjacent layer of the active layer pattern without any layer formed between the active layer pattern and the source electrode, or between the active layer pattern and the drain electrode.

4. The array substrate according to claim 3, wherein the drain electrode and the pixel electrode are disposed in adjacent layers.

5. The array substrate according to claim 4, wherein the active layer pattern is formed on the base substrate, the pixel electrode is also formed on the base substrate,
   one end of the source electrode is connected with one of the data lines, and the other end of the source electrode is formed on the active layer pattern,
   one end of the drain electrode is formed on the active layer pattern, and the other end of the drain electrode is formed on the pixel electrode.

6. The array substrate according to claim 5, wherein the gate lines are formed above the data lines, a first insulation layer is formed between the gate lines and the data lines, and the gate electrode is connected with one of the gate lines and is formed on the first insulation layer above the active layer pattern.

7. The array substrate according to claim 6, wherein a common electrode is further formed in each of the pixel regions, the common electrode forms an electric field with the pixel electrode; and
   wherein a second insulation layer is formed on the gate lines, and the common electrode is formed on the second insulation layer.

8. The array substrate according to claim 7, wherein the pixel electrode is a flat plate electrode and the common electrode is a slit electrode having slits.

* * * * *